United States Patent
Hasegawa

[11] Patent Number: 5,869,878
[45] Date of Patent: Feb. 9, 1999

[54] SEMICONDUCTOR DEVICE WITH TEMPERATURE DETECTING DIODE, METHOD OF FORMING THE DEVICE AND TEMPERATURE DETECTING METHOD USING THE DEVICE

[75] Inventor: Yuji Hasegawa, Tokyo, Japan

[73] Assignee: NEC Corporation, Tokyo, Japan

[21] Appl. No.: 594,499

[22] Filed: Jan. 31, 1996

[30] Foreign Application Priority Data

Jan. 31, 1995 [JP] Japan .................................. 7-034274

[51] Int. Cl.⁶ ............................................ H01L 23/58
[52] U.S. Cl. .................... 257/467; 257/469; 257/341; 257/470; 257/551
[58] Field of Search ............................ 257/469, 467, 257/470, 641, 551

[56] References Cited

U.S. PATENT DOCUMENTS 5,389,813   2/1995   Schwob .................................. 257/469

FOREIGN PATENT DOCUMENTS

| | | |
|---|---|---|
| 56-120153 | 9/1981 | Japan . |
| 63-229758 | 1/1988 | Japan . |
| 1-290249 | 1/1989 | Japan . |
| 1114060 | 5/1989 | Japan . |
| 1196858 | 8/1989 | Japan . |
| 334360 | 2/1991 | Japan . |
| 6-97795 | 1/1994 | Japan . |
| 7-58293 | 1/1995 | Japan . |

OTHER PUBLICATIONS

Japanese Office Action, 3 pages, Jul. 22, 1996, English translation.
Japanese Office Action, May 26, 1998, 2 pages, with English translation.

*Primary Examiner*—Edward Wojciechowicz

[57] ABSTRACT

The object of the present invention is to provide a temperature detecting method wherein a temperature detecting diode is formed in the proximity of and thermally coupled to an object of temperature detection element in the form of a semiconductor element so that, even when a high power is instantaneously applied, the temperature of the object element for temperature detection can be detected with a high degree of accuracy. According to the present invention, in a temperature detecting method for detecting, in a semiconductor device which includes an object element for temperature detection in the form of a semiconductor element and a temperature detecting diode formed in the proximity of the object element for temperature detection, the temperature of the object of temperature detection element from the ambient temperature and heat generated by the element, the temperature detecting diode is formed on the same pellet as that of the element at a position at which more than one half of the circumference thereof is surrounded by the object element for temperature detection.

12 Claims, 10 Drawing Sheets

SEMICONDUCTOR DEVICE WITH TEMPERATURE DETECTING DIODE, METHOD OF FORMING THE DEVICE AND TEMPERATURE DETECTING METHOD USING THE DEVICE

BACKGROUND OF THE INVENTION

1. Field of the Invention

This invention relates to a temperature detecting method which makes use of a forward voltage of a diode, and more particularly to a temperature detecting method wherein an object of temperature detection element in the form of a semiconductor element and a temperature detecting diode formed in the proximity of the object of temperature detection element are thermally coupled to detect the temperature of the element by means of the temperature detecting diode.

2. Description of the Related Art

Conventional temperature detection which makes use of a diode is described with reference to FIGS. 1 to 6.

As a conventional example including a temperature detecting method, a block diagram of a semiconductor device of three terminal construction having a built-in overheat preventing function is shown in FIG. 1. Object of temperature detection element 102 is formed from a bipolar transistor, a field effect transistor or a like element and serves as a heat generating source. Heat 106 generated from object of temperature detection element 102 is transmitted to temperature detecting diode D1. Temperature detecting diode D1 placed at position p converts a temperature into a voltage in accordance with the relationship between temperature T(p) and forward voltage VF(p) of the diode illustrated in FIG. 2.

Overheat protecting circuit 103 obtains voltage VF(p) representative of the temperature of object of temperature detection element 102 from temperature detecting diode D1 and operates switch SW1 to switch on or off in response to the value of voltage VF(p) to control the supplying condition of the input voltage to object of temperature detection element 102 thereby to control the temperature of object element 102.

A construction of a pellet for realizing the block diagram of FIG. 1 is shown in FIGS. 3(a) and 3(b).

Object element 102 for temperature detection such as a bipolar transistor or a field effect transistor and temperature detecting diode D1 are formed in a neighboring relationship to each other on silicon substrate 101 by diffusion processing. Overheat protecting circuit 103 is formed at a location on silicon substrate 101 comparatively far from object of temperature detection element 102. Those elements are connected by aluminum wiring lines or the like so that they cooperatively form a semiconductor device having an overheat preventing function.

An example of temperature detecting method wherein object of temperature detection element 102 and temperature detecting diode D1 are formed in a neighboring relationship to each other on the same chip and thermally coupled to each other to detect the temperature of object element 102 for temperature detection by means of temperature detecting diode D1 in this manner is disclosed, for example, in Japanese Patent Laid-Open Application No. Heisei 01-196858. This document discloses that a temperature detecting circuit which makes use of a forward voltage of a diode is incorporated on a pellet on which a driving transistor is mounted, and the driving transistor and the temperature detecting diode are individually connected to a device. This example is described below.

FIG. 4 is a schematic view showing a structure of the essential part of object element 202 for temperature detection and temperature detecting diode D1 disclosed in the document. The example shown in FIG. 4 employs an N-channel field effect transistor of the enhancement type. In FIG. 4, a portion formed by terminals G, D and S is a field effect transistor serving as object element 202 for temperature detection, and another portion formed from terminals A and K serves as temperature detecting diode D1.

As described above, conventional temperature detecting diode D1 is formed such that it is included in a block adjacent object element 202 for temperature detection such as the block of overheat protecting circuit 203.

A concrete temperature detecting circuit employing temperature detecting diode D1 is shown in FIG. 5. Temperature detecting diode D1 is connected in a forward direction, and detecting current of several mA flows through temperature detecting diode D1. Voltage VF(p) across temperature detecting diode D1 is compared with reference voltage Vref set by resistors R7 and R8 by comparator Cmp1, and voltage Vo is outputted from comparator Cmp1. An example of temperature detecting circuit of the type described above is disclosed in Japanese Patent Laid-Open Application No. Showa 56-120153 or Japanese Patent Laid-Open Application No. Heisei 1-114060.

The temperature detecting circuit disclosed in Japanese Patent Laid-Open Application No. Heisei 56-120153 is constructed such that a diode for detecting the temperature is disposed adjacent another pellet or the same pellet in the proximity of an object element for temperature detection such as a transistor or an IC, and a temperature detecting circuit which makes use of the forward voltage of the diode is incorporated in the outside or the inside of the IC and the forward voltage of the diode including the temperature information is compared with a reference voltage by a comparator or an operational amplifier to control the current flowing through the IC to protect the device. Also overheat protecting circuit 103 shown in FIG. 1 has a similar construction to that disclosed in Japanese Patent Laid-Open Application No. Showa 56-120153.

The temperature detecting circuit disclosed in Japanese Patent Laid-Open Application No. Heisei 1-114060 is constructed such that a temperature detecting circuit including a transistor for detecting the temperature is disposed in the proximity of an object element for temperature detection and makes use of a forward voltage of the diode between the base and the emitter of a transistor forming an IC to control the current of a power source connected to the IC to protect the device.

The temperature distribution on the section taken along line Z-Z' of the schematic views of FIGS. 3(a) and 3(b) including temperature detecting diode D1 immediately after a high power is instantaneously applied to the semiconductor device shown in FIGS. 3(a) and 3(b) is such as that shown in FIG. 6.

The temperature distribution on the section taken along line Z-Z' usually exhibits the highest temperature (Tmax) at the location of object element 102 for temperature detection, and the temperature of temperature detecting diode D1 spaced by distance p from object of temperature detection element 102 is T(p) which is lower than temperature Tmax of element 102.

Where the applied power is represented by P, the maximum temperature of element 102 is represented by Tmax and the thermal resistance between temperature detecting diode D1 at position p and element 102 is represented by Rth(p), temperature T(p) at position p of temperature detecting diode D1 in the conventional example is given by following equation 1:

$$T(p) = Tmax - P \times Rth(p) \qquad \text{equation 1}$$

Further, when sufficient time elapses after power is applied to the semiconductor device, the temperatures of both element 102 and temperature detecting diode D1 approach a substantially uniform temperature.

However, in the prior art described above, as seen from FIGS. 3(a) and 3(b), a thermal resistance originating from the thermal conductivity and/or the distance between object of temperature detection element 102, which also serves as a heat generating source, and temperature detecting diode D1, and particularly when a high power is instantaneously applied or in a like case, a difference arises between temperature Tmax of element 102 and temperature T(p) of temperature detecting diode D1 as seen in FIG. 6. Consequently, where the prior art is applied to an overheat protecting circuit or a like circuit, there is a problem in that the temperature of element 102 may become higher than an overheat protecting temperature set in advance by resistance R7 and resistance R8 of the temperature detecting circuit of FIG. 5.

This problem is not significant while the input power to the semiconductor is low. However, when a high power is inputted instantaneously, the problem becomes significant. Accordingly, not only realization of a semiconductor device having an overheat protecting function or a like function is difficult, but also there is the possibility that the life of the semiconductor device may be reduced by inadvertent application of a high power.

SUMMARY OF THE INVENTION

The present invention has been made in view of the problems of the prior art described above, and it is an object of the present invention to provide a semiconductor device provided with a temperature detecting diode which is improved in accuracy of the detected temperature and has an increased life and a forming method for and a temperature detecting method of the semiconductor device.

According to an aspect of the present invention, there is provided a method of forming a semiconductor device provided with a temperature detecting diode formed in the proximity of an object of temperature detection element for detecting a temperature of the element from the ambient temperature and heat generated by the element, characterized in that, in order to reduce the thermal resistance between the object of temperature detection element and the temperature detecting diode, the temperature detecting diode is formed on the same pellet as that of the object of temperature detection element in such a manner that more than one half of the circumference thereof is surrounded by the element.

According to another aspect of the present invention, there is provided a method of forming a semiconductor device provided with a temperature detecting diode formed in the proximity of an object of temperature detection element for detecting a temperature of the object from the ambient temperature and the heat generated by the element, characterized in that the temperature detecting diode and the object of temperature detection element are formed on the same pellet, and a heat conducting member is formed on a surface of the pellet including at least some portions of the temperature detecting diode and the object of temperature detection element and an area interconnecting the temperature detecting diode and the object of temperature detection element.

According to a further aspect of the present invention, there is provided a semiconductor device provided with a temperature detecting diode formed in the proximity of an object of temperature detection element for detecting a temperature of the element from the ambient temperature and heat generated by the element, characterized in that, in order to reduce the thermal resistance between the object of temperature detection element and the temperature detecting diode, the temperature detecting diode is formed on the same pellet as that of the object of temperature detection element in such a manner that more than one half of the circumference thereof is surrounded by the object of temperature detection element.

According to a still further aspect of the present invention, there is provided a semiconductor device provided with a temperature detecting diode formed in the proximity of an object element for temperature detection for detecting a temperature of the object element for temperature detection from the ambient temperature and heat generated by the object element for temperature detection, characterized in that the temperature detecting diode and the object of temperature detection element are formed on the same pellet, and a heat conducting member is formed on the surface of the pellet including at least some portions of the temperature detecting diode and the object of temperature detection element and an area interconnecting the temperature detecting diode and the object of temperature detection element.

According to a still further aspect of the present invention, a temperature detecting method by a semiconductor device provided with a temperature detecting diode constructed in such a manner as described above is characterized in that a pair of temperature detecting diodes are formed such that thermal resistances between the object of temperature detection element and the temperature detecting diodes are different from each other, and a temperature of the object of temperature detection element is calculated based on forward voltages of the pair of temperature detecting diodes.

In any of the temperature detecting methods described above, means for constructing the different thermal resistances may include at the least distances between the object of temperature detection element and the temperature detecting diodes, and the temperature of the element may be detected by linear approximation based on the distances from the element to the pair of temperature detecting diodes.

Alternatively, means for constructing the different thermal resistances may include at the least distances between the object of temperature detection element and the temperature detecting diodes, and the temperature of the element may be detected by second order approximation based on the distances from the element to the pair of temperature detecting diodes, assuming that the differential coefficient of the temperature of the object element for temperature detection is zero.

According to the present invention, since the thermal resistance between the object of temperature detection element serving as a heat generating source and the temperature detecting diode is reduced, even if a high power is instantaneously applied, the temperature difference which may arise between the element and the temperature detecting element is reduced. Further, even if a temperature difference is produced between the element and the temperature detecting diode, by detecting the temperature of the element by calculation making use of the outputs of the two temperature detecting diodes, the temperature difference can be calculated to correct the temperature of the element.

DETAILED DESCRIPTION OF THE PREFERRED EMBODIMENTS

Embodiments of the present invention are described below with reference to the drawings.

Embodiment 1

The first embodiment of the present invention is described with reference to FIGS. 7(a), 7(b) and 8.

Figure 7A:
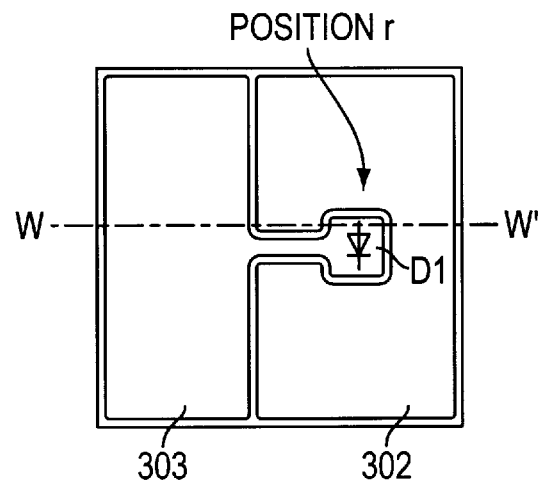
FIGS. 7(a) and 7(b) are schematic views showing a construction of a pellet according to a first embodiment of the present invention.
Figure 7B:
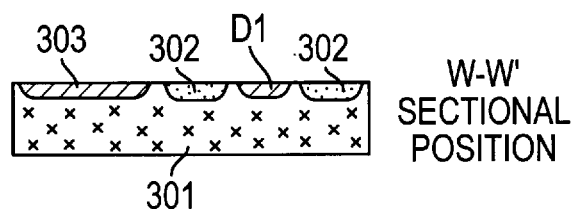
Figure 8:
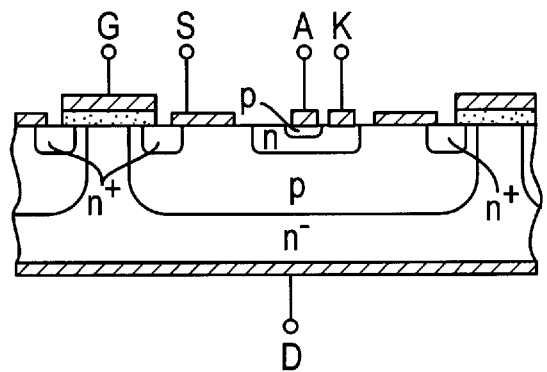
FIG. 8 is a schematic view showing a structure of essential part of the embodiment shown in FIGS. 7(a) and 7(b)

FIG. 7(a) is a schematic view of a construction of a pellet of a temperature detecting method showing the embodiment of the present invention, FIG. 7(b) is a sectional view taken along line W-W' of FIG. 7(a), and FIG. 8 is a schematic sectional view showing a structure of essential part of the pellet.

Referring to FIGS. 7(a) and 7(b), object element 302 for temperature detection in the form of a bipolar transistor, a field effect transistor or a like element and temperature detecting diode D1 are formed in a neighboring relationship on single silicon substrate 301, and also overheat protecting circuit 303 is formed on silicon substrate 301. Those elements are connected by aluminum wiring lines so that they may cooperatively form a semiconductor device having an overheat protecting function.

The present embodiment is characterized in that temperature detecting diode D1 is formed at a location on the same pellet surrounded by object of temperature detection element 302, which serves as a heat source, and in which element 302 is partially located in the region to be used for wiring between temperature detecting diode D1 and overheat protecting circuit 303.

A structure of the essential part of the present embodiment is shown in FIG. 8. The present embodiment employs an N-channel field effect transistor of the enhancement type, and temperature detecting diode D1 formed from terminals A and K in a block separated from source terminal S side of object of temperature detection element 302 is connected to a control circuit such as overheat protecting circuit 303 by means of an aluminum wiring line on the surface of the pellet.

It is to be noted that temperature detecting diode D1 may be formed otherwise in a block at a location surrounded by object of temperature detection element 302 and separated from element 302.

In the present embodiment, since temperature detecting diode D1 is formed in the block of element 302, the two elements are formed very closely to each other.

Further, while element 302 and temperature detecting diode D1 conventionally contact with each other over less than about one half their circumference, element 302 and temperature detecting diode D1 in the present embodiment contact with each other over substantially their full circumferences. Consequently, comparing with the prior art, the contacting portions between element 302 and temperature detecting diode D1 are increased to more than about two times in magnitude and the thermal resistance between them is reduced to less than about one half. Also the temperature difference which arises between element 302 and temperature detecting diode D1 is reduced to less than about one half.

Embodiment 2

The second embodiment of the present invention is described below with reference to FIGS. 9 and 10.

Figure 9:
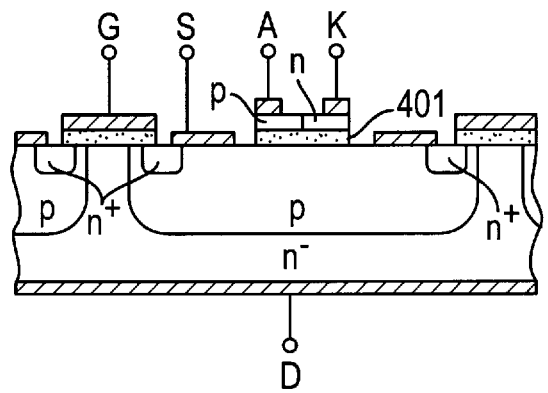
FIG. 9 is a schematic view showing a structure of essential part of a second embodiment of the present invention.

FIG. 9 is a schematic sectional view showing a structure of the essential part of the second embodiment of the present invention.

The present embodiment is different from the first embodiment described above in that insulator 401 of silicon dioxide or a like substance is formed on the surface of a pellet at a location which is surrounded by object of temperature detection element 302 and at which temperature detecting diode D1 is to be formed to establish insulation between element 302 and temperature detecting diode D1, and in this condition, temperature detecting diode D1 is formed.

The forming method of the present embodiment is advantageous in that, although an increased number of process steps are required, the degree of freedom of the position at which temperature detecting diode D1 is to be formed increases.

Figure 10:
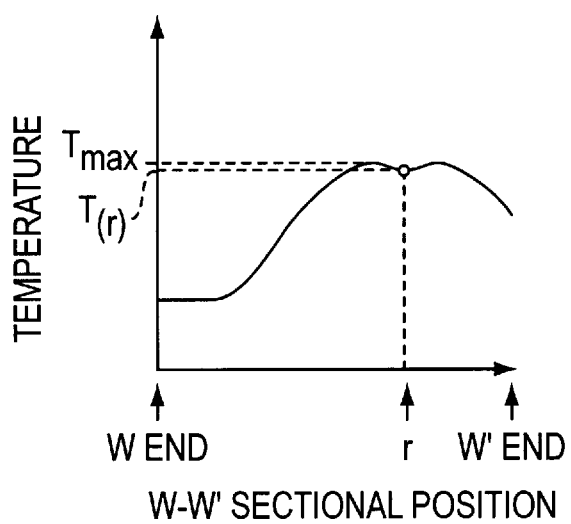
FIG. 10 is a diagram illustrating a temperature distribution in a pellet according to the second embodiment of the present invention.

FIG. 10 is a diagram showing a temperature distribution in a section of the semiconductor device including temperature detecting diode D1 (the section taken along line W-W' of FIG. 7) immediately after a high power is instantaneously applied to the semiconductor device of the construction described above.

Where the applied power is represented by P, the maximum temperature of object element 302 for temperature detection is represented by Tmax, and the thermal resistance between temperature detecting diode D1 and element 302 at position r is represented by Rth(r), temperature T(r) at position r of temperature detecting diode D1 in the present embodiment is given by following equation 2:

$$T(r)=Tmax-P \times Rth(r) \qquad \text{equation 2}$$

Figure 6:
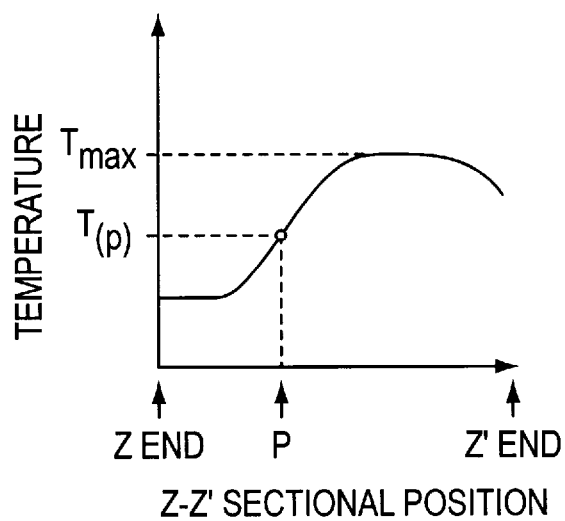
FIG. 6 is a diagram illustrating a temperature distribution in the pellet of the conventional example shown in FIGS. 3(a) and 3(b)

The temperature difference between the temperature of temperature detecting diode D1 and temperature Tmax of object element 302 for temperature detection in the present embodiment is P×Rth(r), and this temperature difference is smaller than temperature difference P×Rth(p) between temperature T(p) at position p of temperature detecting diode D1 of FIG. 6 which illustrates the temperature distribution of the conventional example and temperature Tmax of element 302. Consequently, the thermal resistance can be reduced, and accordingly, the accuracy of the detected temperature can be improved.

The present embodiment is advantageous in that, since temperature detecting diode D1 and element 302 have no overlapping portion between them, they can be produced by the same step as the conventional diffusion process.

It is to be noted that it is otherwise possible to dispose element 302 around the entire periphery of temperature detecting diode D1 and dispose a wiring line between temperature detecting diode D1 and overheat protecting circuit 303 on element 302.

Embodiment 3

Next, the third embodiment of the present invention is described with reference to FIGS. 11(a) and 11(b), 12 and 13.

Figure 11A:
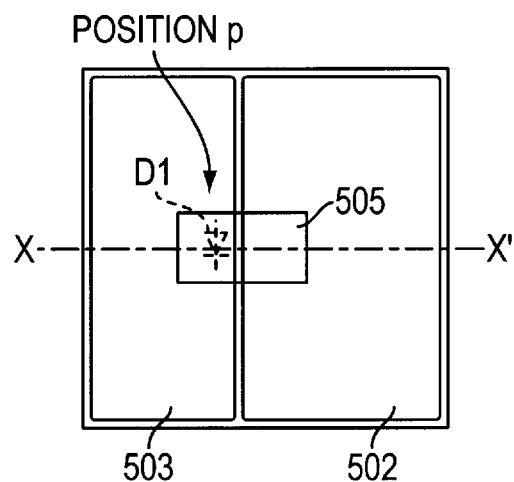
FIGS. 11(a) and 11(b) are schematic views showing a construction of a pellet according to a third embodiment of the present invention.
Figure 11B:
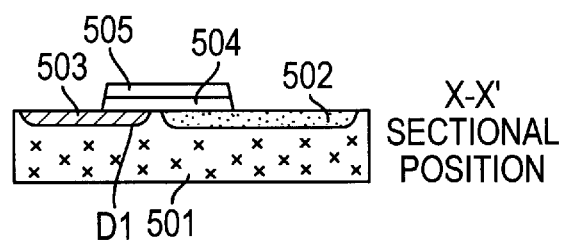
Figure 12:
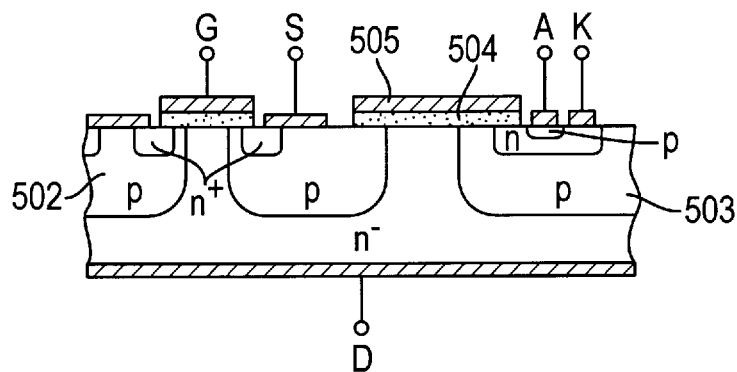
FIG. 12 is a schematic view showing a structure of essential part of the embodiment shown in FIGS. 11(a) and 11(b)

FIG. 11(a) is a schematic view showing a construction of a pellet according to the present embodiment, FIG. 11(b) is a sectional view taken along line X-X' of FIG. 11(a), and FIG. 12 is a schematic sectional view showing a structure of the essential part of the pellet.

Referring to FIGS. 11(a) and 11(b), object of temperature detection element 502 formed from a bipolar transistor, a field effect transistor or a like element and overheat protecting circuit 503 are formed on silicon substrate 501 by diffusion processing, and also temperature detecting diode D1 is formed on silicon substrate 501.

The present embodiment is characterized in that heat conducting member 505 of a metal material such as aluminum or copper is formed on the surface of the pellet over portions of temperature detecting diode D1 and object of temperature detection element 502 with insulating member 504 of silicon dioxide, alumina or a like substance interposed therebetween. Heat conducting member 505 is produced by forming, after formation of a pellet by a conventional method, a film of a metal material with the thickness of 1 μm, for example, on an insulating material of 0.2 μm thick by sputtering or vapor deposition and then patterning only the metal film by ion etching or a like technique.

Figure 1:
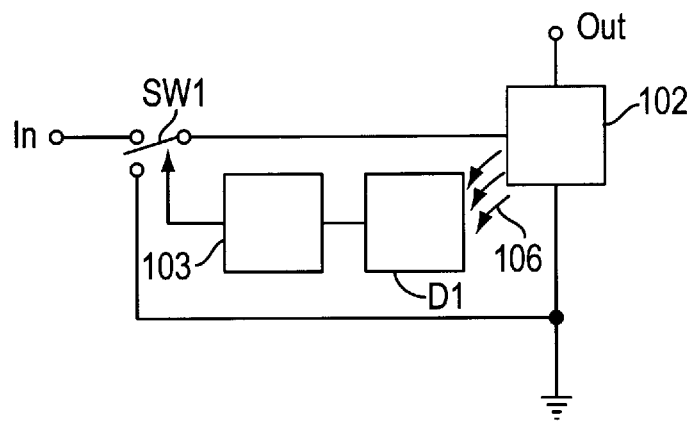
FIG. 1 is a block diagram showing a construction of a semiconductor having an overheat protecting function illustrating a conventional example.
Figure 2:
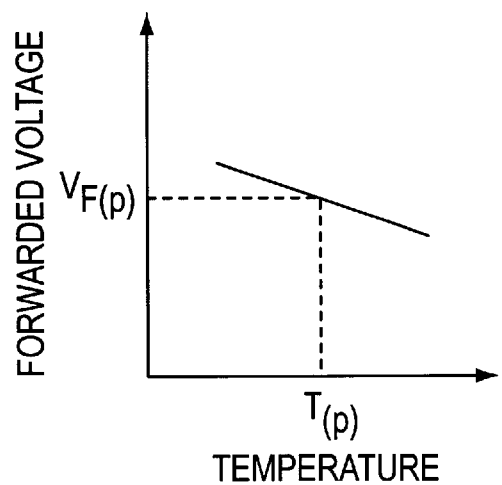
FIG. 2 is a diagram illustrating a relationship between the forward voltage and the temperature of a diode.
Figure 3A:
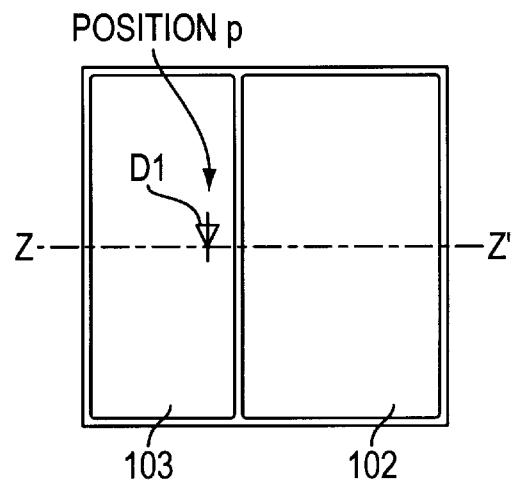
FIGS. 3(a) and 3(b) are schematic views showing a construction of a pellet by the conventional example.
Figure 3B:
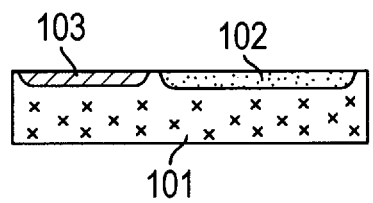
Figure 4:
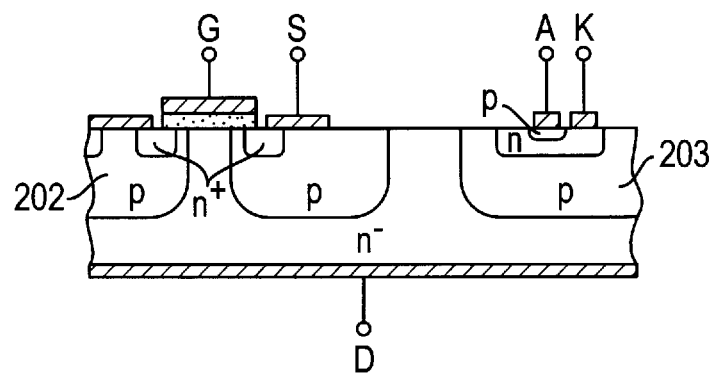
FIG. 4 is a schematic view showing a structure of essential part of the conventional example shown in FIGS. 3(a) and 3(b)
Figure 5:
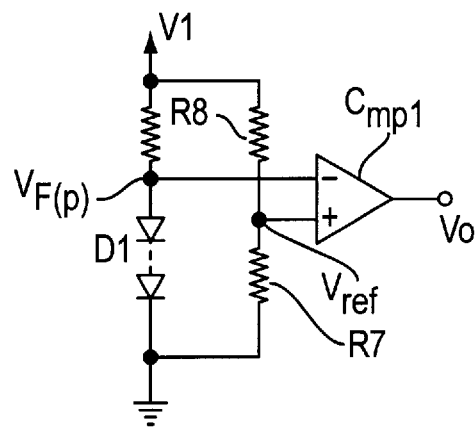
FIG. 5 is a circuit diagram of a temperature detecting circuit of the conventional example shown in FIGS. 3(a) and 3(b)

FIG. 12 is a schematic sectional view showing a structure of the essential part of the present embodiment. The present embodiment is different from the conventional example shown in FIG. 4 in that heat conducting member 505 of aluminum, copper or a like metal is formed on the surface of the pellet over both temperature detecting diode D1 and object element 502 for temperature detection while assuring insulation between them by means of insulating member 504 of silicon dioxide or a like material.

Where copper is used for heat conducting member 505 provided over element 502 and temperature detecting diode D1 in the present embodiment, since the thermal conductivity of it is higher by more than twice the thermal conductivity of silicon used as a substrate material and is higher than the thermal conductivity of a resin for encapsulation, the thermal resistance between element 502 and temperature detecting diode D1 can be reduced.

Figure 13:
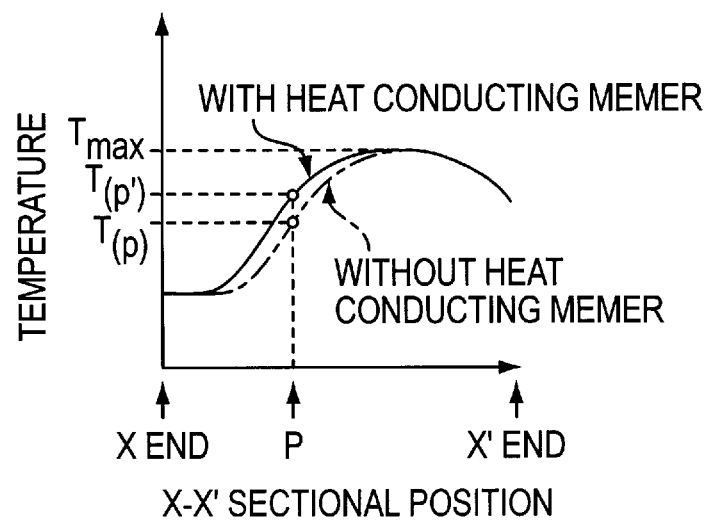
FIG. 13 is a diagram illustrating a temperature distribution in the pellet according to the embodiment shown in FIGS. 11(a) and 11(b)

FIG. 13 is a diagram illustrating a temperature distribution along a section of the semiconductor device of the construction described above including temperature detecting diode D1 (the section taken along line W-W' in FIG. 7) immediately after a high power is instantaneously applied.

The curve indicated by an alternate long and short dash line in FIG. 13 is a re-representation of the temperature distribution of the conventional example illustrated in FIG. 6 when heat conducting member 505 is not involved. Meanwhile, the other curve indicated by a solid line presents the temperature distribution in the present embodiment.

Where the applied power is represented by P, the maximum temperature element 502 is represented by Tmax, and the thermal resistance between temperature detecting diode D1 and element 502 at position p in the present embodiment is represented by Rth(p'), temperature T(p') at position p of temperature detecting diode D1 in the present embodiment is given by following equation 3:

$$T(p')=Tmax-P \times Rth(p') \qquad \text{equation 3}$$

The temperature difference between the temperature of temperature detecting diode D1 and temperature Tmax of element 502 in the present embodiment is P×Rth(p'), and this temperature difference is smaller than temperature difference P*Rth(p) between temperature T(p) at position p of temperature detecting diode D1 of FIG. 6 which illustrates the temperature distribution of the conventional example and temperature Tmax of object element 302. Consequently, the thermal resistance can be reduced, and accordingly, the accuracy of the detected temperature can be improved.

It is to be noted that heat conducting member 505 between temperature detecting diode D1 and element 502 can otherwise be formed intermittently. Further, also it is possible to form heat conducting member 505 simultaneously with the wiring step between the elements after the diffusion processing.

Embodiment 4

Next, the fourth embodiment of the present invention is described with reference to FIGS. 14(a) and 14(b), 15, 16 and 17.

Figure 14A:
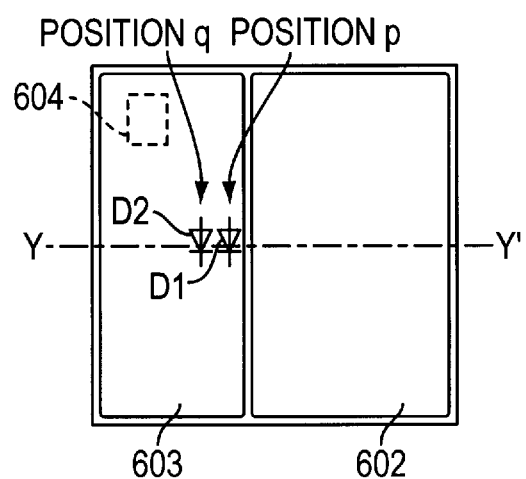
FIGS. 14(a) and 14(b) are schematic views showing a construction of a pellet according to a fourth embodiment of the present invention.
Figure 14B:
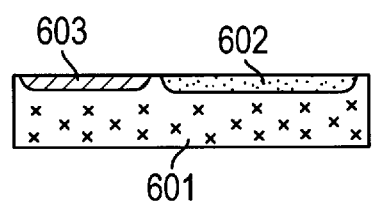

FIG. 14(a) is a schematic view showing a construction of a pellet according to the present embodiment, and FIG. 14(b) is a sectional view taken along line Y-Y' of FIG. 14(a).

Referring to FIGS. 14(a) and 14(b), object element 602 for temperature detection and overheat protecting circuit 603 are formed on silicon substrate 601, and also temperature detecting diodes D1 and D2 are formed on silicon substrate 601.

The present embodiment is characterized in that temperature detecting diodes D1 and D2 having the same specifications of FIGS. 14(*a*) and 14(*b*) are disposed at positions p and q with reference to position o and that temperature detecting circuit 604 forming overheat protecting circuit 603 detects the temperature of element 602 by calculation making use of the outputs of two temperature detecting diodes D1 and D2.

In particular, where the temperatures at positions p and q with reference to position o are represented by T(p) and T(q), temperature T(o) at reference position o of object element 602 for temperature detection is given by following equation 4:

$$T(o) = [q \times T(p) - p \times T(q)]/(q-p) \qquad \text{equation 4}$$
$$= T(p) + [T(p) - T(q)] \times p/(q-p)$$

Here, reference position o is set in advance to a position in the proximity of object element 602 for temperature detection.

Figure 17:
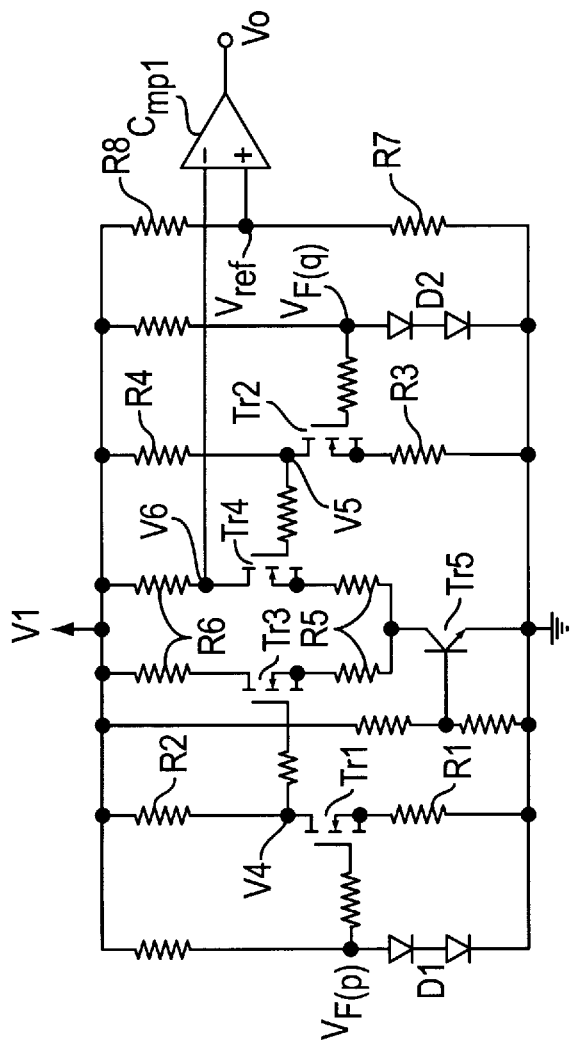
FIG. 17 is a circuit diagram of a temperature detecting circuit of the embodiment shown in FIGS. 14(a) and 14(b).

An example wherein the calculation given by equation 4 above is performed by the hardware of temperature detecting circuit 604 is shown in FIG. 17.

Detection current of several mA flows in a forward direction through two temperature detecting diodes D1 and D2.

The voltage across temperature detecting diode D1 is VF(p) and is converted to voltage V4=q×VF(p) by resistors R1 and R2. The voltage across the other temperature detecting diode D2 is VF(q) and is converted into voltage V5=p×VF(q) by resistors R3 and R4.

A difference between voltages V4 and V5 is detected by a differential circuit formed from transistors Tr3 and Tr4, and simultaneously, a voltage obtained by multiplying the difference by 1/(q−p) by means of resistors R5 and R6 is outputted as voltage V6. Voltage V6 thus obtained is compared with reference voltage Vref set in advance by resistors R7 and R8 by comparator Cmp1 to detect whether or not voltage V6 is higher than reference voltage Vref, and a result of the comparison is outputted as voltage Vo from comparator Cmp1. Also the calculating circuit can be realized with a comparatively simple circuit construction in this manner.

Figure 15:
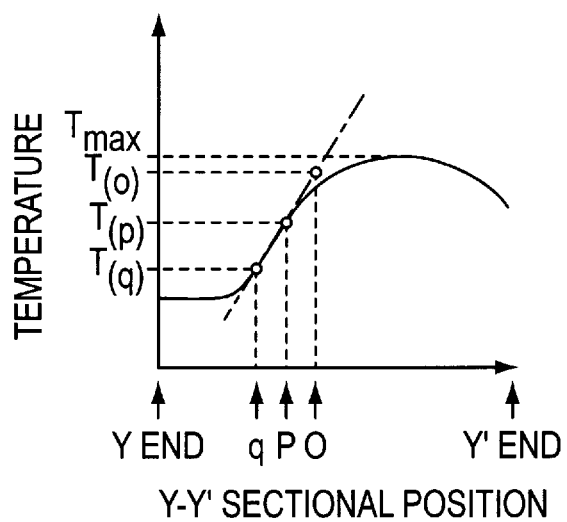
FIG. 15 is a diagram illustrating a temperature distribution in the pellet according to the embodiment shown in FIGS. 14(a) and 14(b)

FIG. 15 is a diagram illustrating the temperature distribution on the section taken along line Y-Y' of FIG. 14 immediately after a high power is instantaneously applied to the semiconductor device of the present embodiment.

Referring to FIG. 15, the actually measured values are temperatures T(p) and T(q) at positions p and q, and temperature To at the reference position is a calculated value.

In the present embodiment, since temperature correction is performed by calculation, the temperature difference between temperature To of object of temperature detection element 602 thus obtained and actual temperature Tmax of element 602 is smaller than the temperature difference between temperature T(p) at position p of temperature detecting diode D1 of FIG. 6 which illustrates the temperature distribution of the conventional example and temperature Tmax of element 102. Consequently, the accuracy of the detected temperature is improved.

It is to be noted that, as another calculation method, the temperature of element 602 may be calculated by second order approximate calculation from the forward voltages of temperature detecting diodes D1 and D2 located at positions p and q with reference to position o assuming that the differential coefficient of the temperature at reference position o of element 602 is zero and that the positions and the forward voltages are in a relationship of a curve of the second order.

In particular, where the temperatures at positions p and q with reference to position o of element 602 are represented by T(p) and T(q), temperature To of element 602 is calculated from following equation 5:

$$To = [q2 \times T(p) - p2 \times T(q)]/(q2 - p2) \qquad \text{equation 5}$$
$$= T(p) + [T(p) - T(q)] \times p2/(q2 - p2)$$

Figure 16:
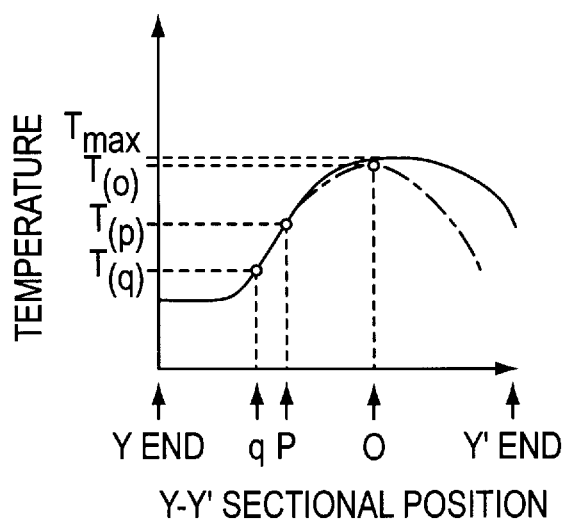
FIG. 16 is a diagram illustrating a temperature distribution in a pellet of a modification to the embodiment shown in FIGS. 14(a) and 14(b)

FIG. 16 is a diagram illustrating the temperature distribution on the section taken along line Y-Y' of FIG. 14 immediately after a high power is instantaneously applied to the semiconductor device described above. The accuracy of the detected temperature is improved by an action similar to that in the case of the linear approximation described hereinabove with reference to FIG. 15.

Further, since the upper expression and the lower expression of equation 5 are different only in coefficients and can be represented in the same form, an actual circuit construction can be applied merely by changing the circuit constants of the temperature detecting circuit of linear approximation illustrated in FIG. 17 such that p is changed to p squared and q is changed to q squared.

As described above, according to the present invention, by making use of the forward voltage of a temperature detecting diode, a temperature variation when a high power is instantaneously applied to an object element for temperature detection can be detected with a high degree of accuracy, and a semiconductor device having a temperature detecting function can be realized readily. Further, there is another advantage in that, when a high power is applied inadvertently, the possibility that the life of the semiconductor device may be reduced can be reduced.

Furthermore, since the element temperature can be controlled with a high degree of accuracy so that it may not rise extraordinarily even upon short-circuiting of a load or in a like case, there is another advantage in that a device having a high resistance to destruction can be produced in a reduced size at a reduced cost.

What is claimed is:

1. A temperature detecting method by a semiconductor device including a temperature detecting diode formed in the proximity of an object of temperature detection element for detecting a temperature of the element from the ambient temperature and heat generated by the element, the method comprising the steps of forming a pair of temperature detecting diodes in the proximity of the object of temperature detecting element such that thermal resistances between the object of temperature detection element and said temperature detecting diodes are different from each other, and calculating a temperature of the element based on forward voltages of said pair of temperature detecting diodes.

2. A temperature detecting method as claimed in claim 1, and further comprising the steps of providing means for constructing the different thermal resistances which include at the least distances between the object of temperature detection element and said temperature detecting diodes, and detecting the temperature of the object of temperature detection element by linear approximation based on the distances from the object of temperature detection element to said pair of temperature detecting diodes.

3. A temperature detecting method as claimed in claim 1, and further comprising the steps of providing means for constructing the different thermal resistances which include at least distances between the object of temperature detection element and said temperature detecting diodes, and detecting the temperature of the element by second order approximation based on the distances from the object element for temperature detection to said pair of temperature detecting diodes assuming that the differential coefficient of the temperature of the object of temperature detection element is zero.

4. A temperature detecting method by a semiconductor device including a temperature detecting diode formed in the proximity of an object of temperature detection element for detecting a temperature of the object element for temperature detection from the ambient temperature and heat generated by the element, the method comprising the steps of forming said temperature detecting diode, in order to reduce the thermal resistance between the object of temperature detection element and said temperature detecting diode, as a pair of temperature detecting diodes on the same pellet as that of the element at a position at which more than one half of the circumference of each of said temperature detecting elements thereof is surrounded by the object of temperature detection element and such that thermal resistances between the element and said temperature detecting diodes are different from each other, and calculating a temperature of the element based on forward voltages of said pair of temperature detecting diodes.

5. A temperature detecting method by a semiconductor device including a temperature detecting diode formed in the proximity of an object of temperature detection element for detecting a temperature of the element from the ambient temperature and heat generated by the element, the method comprising the steps of forming said temperature detecting diode as a pair of temperature detecting diodes on the same pellet as that of the object of temperature detection element while forming a heat conducting member on a surface of said pellet including at least portions of said temperature detecting diode and the element and an area interconnecting said temperature detecting diode and the element such that thermal resistances between the element and said temperature detecting diodes are different from each other, and calculating a temperature of the element based on forward voltages of said pair of temperature detecting diodes.

6. A temperature detecting method as claimed in claim 4, and further comprising the steps of providing means for constructing the different thermal resistances which include at the least distances between the object of temperature detection element and said temperature detecting diodes, and detecting the temperature of the element by linear approximation based on the distances from the element to said pair of temperature detecting diodes.

7. A temperature detecting method as claimed in claim 5, and further comprising the steps of providing means for constructing the different thermal resistances which include at the least distances between the object of temperature detection element and said temperature detecting diodes, and detecting the temperature of the element by linear approximation based on the distances from the element to said pair of temperature detecting diodes.

8. A temperature detecting method as claimed in claim 4, and further comprising the steps of providing means for constructing the different thermal resistances which include at the least distances between the object of temperature detection element and said temperature detecting diodes, and detecting the temperature of the element by second order approximation based on the distances from the element to said pair of temperature detecting diodes assuming that the differential coefficient of the temperature of the element is zero.

9. A temperature detecting method as claimed in claim 5, and further comprising the steps of providing means for constructing the different thermal resistances which include at the least distances between the object element for temperature detection and said temperature detecting diodes, and detecting the temperature of the element by second order approximation based on the distances from the element to said pair of temperature detecting diodes, assuming that the differential coefficient of the temperature of the element is zero.

10. A semiconductor device comprising an object of temperature detection element and a temperature detecting diode formed in the proximity of said element for detecting a temperature of the element from the ambient temperature and heat generated by the element, and further comprising a pair of temperature detecting diodes formed such that thermal resistances between said object of temperature detection element and said temperature detecting diodes are different from each other, and a temperature detecting circuit for detecting a temperature of said element based on forward voltages of said pair of temperature detecting diodes.

11. A semiconductor device as claimed in claim 10, wherein distances between the object of temperature detection element and said temperature detecting diodes are made different from each other in order to realize different thermal resistances, and said temperature detecting circuit detects the temperature of the element by linear approximation based on the distances from the element to said pair of temperature detecting diodes.

12. A semiconductor device as claimed in claim 10, wherein distances between the object of temperature detection element and said temperature detecting diodes are made different from each other in order to realize different thermal resistances, and said temperature detecting circuit detects the temperature of the element by second order approximation based on the distances from the element to said pair of temperature detecting diodes assuming that the differential coefficient of the temperature of the element is zero.

* * * * *